(12) United States Patent
Shioda

(10) Patent No.: US 7,603,005 B2
(45) Date of Patent: Oct. 13, 2009

(54) OPTICAL CIRCUIT BOARD AND OPTICAL AND ELECTRIC COMBINED BOARD

(75) Inventor: Tsuyoshi Shioda, Chiba (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 128 days.

(21) Appl. No.: 11/792,140

(22) PCT Filed: Nov. 22, 2005

(86) PCT No.: PCT/JP2005/021445

§ 371 (c)(1),
(2), (4) Date: Jun. 1, 2007

(87) PCT Pub. No.: WO2006/059510

PCT Pub. Date: Jun. 8, 2006

(65) Prior Publication Data

US 2008/0124024 A1    May 29, 2008

(30) Foreign Application Priority Data

Dec. 2, 2004   (JP) .............................. 2004-350152

(51) Int. Cl.
*G02B 6/12* (2006.01)
*G02B 6/26* (2006.01)
*G02B 6/42* (2006.01)

(52) U.S. Cl. .............................. 385/14; 385/31; 385/39
(58) Field of Classification Search ..................... 385/14
See application file for complete search history.

(56) References Cited

U.S. PATENT DOCUMENTS

| 4,465,333 | A  | * | 8/1984  | Caserta et al. ................. 385/73 |
| 5,835,646 | A  |   | 11/1998 | Yoshimura et al. |
| 6,438,281 | B1 |   | 8/2002  | Tsukamoto et al. |
| 6,516,104 | B1 |   | 2/2003  | Furuyama |
| 6,804,423 | B2 |   | 10/2004 | Tsukamoto et al. |
| 6,810,160 | B2 |   | 10/2004 | Sugama et al. |

FOREIGN PATENT DOCUMENTS

JP     03-188402 A     8/1991

(Continued)

OTHER PUBLICATIONS

Osamu Mikami et al., "Hikari Hyomen Jisso Gijutsu no Shinten", The Transactions of the Institute of Electros, Sep. 1, 2001, pp. 715-726, J84-C, No. 9 and partial translation.

*Primary Examiner*—Uyen Chau N Le
*Assistant Examiner*—Kajli Prince
(74) *Attorney, Agent, or Firm*—Buchanan Ingersoll & Rooney PC

(57) ABSTRACT

The present invention is to provide an optical circuit board enabling the easy alignment of the positions of a core of an optical pin with the positions of a core of an optical waveguide layer with a simple structure. The optical circuit board comprises an optical wiring layer (31) having optical waveguides (35) and the optical pin (32) is inserted into a hole (34) formed in the optical wiring layer and cutting a part of the optical waveguide. The optical pin comprises a core (2) and a clad, and first recesses (5) are formed in one of its outer surfaces. Projections (33) used as guides for positioning the optical pin together with the recesses are formed on one of the wall surfaces of the hole.

16 Claims, 10 Drawing Sheets

FOREIGN PATENT DOCUMENTS

| | | | |
|---|---|---|---|
| JP | 04-098072 A | | 3/1992 |
| JP | 06-118275 A | | 4/1994 |
| JP | 06118275 | * | 4/1994 |
| JP | 2004-094070 A | | 3/2004 |
| JP | 2004094070 | * | 3/2004 |
| TW | 323976 | | 1/1998 |
| TW | 511182 | | 11/2002 |
| TW | 581746 | | 4/2004 |

* cited by examiner

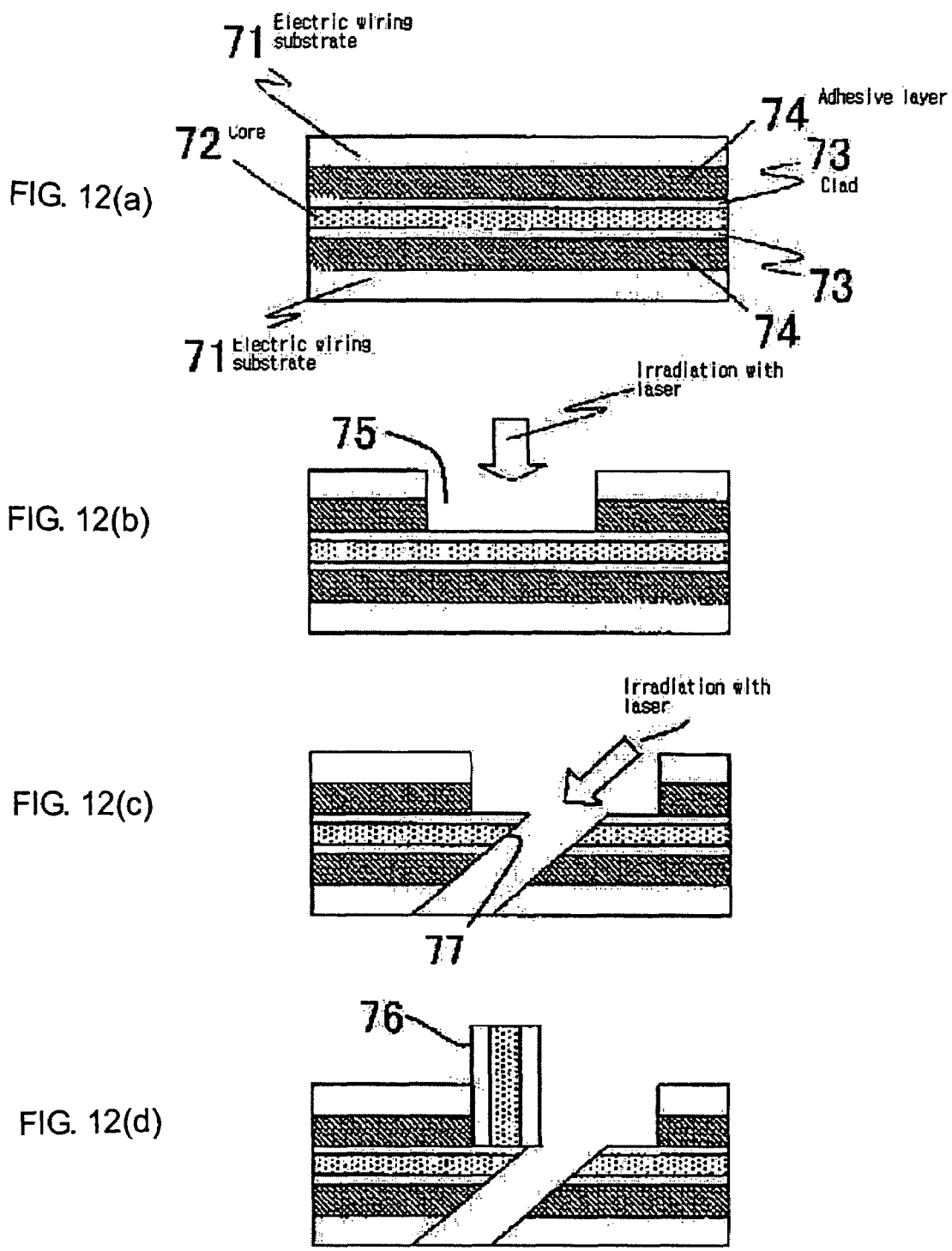

US 7,603,005 B2

OPTICAL CIRCUIT BOARD AND OPTICAL AND ELECTRIC COMBINED BOARD

TECHNICAL FIELD

The present invention relates to a method for aligning the position of an optical pin which performs waveguiding of light or conversion of optical path in an optical circuit board using a polymer optical waveguide.

BACKGROUND ART

Inorganic materials such as quartz glass, multi-component glass or the like, which are characterized by a low optical transmission loss and a wide transmission band, have been widely used as a base material for optical components or optical fibers. Recently, polymer materials have also been developed and are made attractive as materials for optical waveguides because they are superior in workability and cost as compared to the inorganic materials. For example, proposed is a flat plate type optical waveguide having a core-clad structure where a core is formed of a polymer with an excellent transparency, such as polymethyl methacrylate (PMMA) or polystyrene, and a cladding material is formed of a polymer having a refractive index lower than that of the core material (Patent Document 1). On the other hand, a flat plate type optical waveguide with lower loss has been realized by using a polyimide which is a transparent polymer of high thermal resistance (Patent Document 2).

As one of applications of a polymer optical waveguide, an optical and electric combined board is considered. It is a substrate in which an optical waveguide layer is formed in an upper layer, a lower layer or an inner layer of a printed wiring board. At this time, it is important to develop a method for optical coupling between a surface type optical element and an optical waveguide layer to be mounted on the optical and electric combined board. Since the optical axis of the surface type optical element and that of the optical waveguide layer are different by 90 degrees, there is a need to perform a 90 degree optical path conversion. As the method for optical path conversion, there has been proposed a short optical fiber or a short optical waveguide (each generally called an optical pin) for linking between the surface type optical element and the optical waveguide layer (Non-patent Document 1). When an optical pin is used, accuracy in the position alignment between the optical pin and the optical waveguide layer becomes important. So, in order to align the position, a position alignment guide is prepared with high accuracy at a position different from that of the core of the optical pin such as a connector, and a method for aligning the position with the help of the guide is considered. However, since length accuracy of the optical pin, respective dimensional accuracy of the guide and the guide hole, position accuracy of the guide and the core, and the like are required to be high, the cost involved in forming the guide might possibly be increased. Furthermore, when the optical pin is formed in a shape of a connector, it becomes difficult to mount the surface type optical element or other elements thereon.

Patent Document 1: Japanese Patent Laid-open No. 1991-188402

Patent Document 2: Japanese Patent Laid-open No. 1992-98072

Non-patent Document 1: The Institute of Electronics, Information and Communication Engineers Transactions 2001/9, Vol. J84-C No. 9, pages 724-725

DISCLOSURE OF THE INVENTION

In order to avoid the aforementioned problems, an object of the present invention is to provide an optical circuit board enabling easy alignment of the positions of a core of an optical pin with the positions of a core of an optical waveguide layer with a simple structure.

The present invention relates to an optical circuit board comprising a hole, a first optical waveguide inserted into the hole and equipped with a core extended in the depth direction of the hole and equipped with a clad, a second optical waveguide having a core extended in the in-plane direction, position alignment guides in the form of a recess or a projection respectively formed on one of its outer surfaces of the first optical waveguide and one of wall surfaces of said hole, and a reflective surface for converting the direction of the optical path of the first optical waveguide to the optical path of the second optical waveguide. Thus, a recess on one side and a projection on the other side are used together as a position alignment guide. Just by pressing the optical pin that is a first optical waveguide against the guide-formed wall surface, and inserting it into the hole of the optical circuit board, the positions are determined. The position of the recess or projection of the optical pin may be the position of the core or may be away from the core. Meanwhile, the above hole may pass through the optical circuit board or one side thereof may be blocked. Further, both end planes of the core of the optical pin may be perpendicular to the optical axis of the core, and at least one end plane may be slanted against the optical axis of the core. In the former case, waveguiding of light can be performed between both surfaces of the optical circuit board, while in the latter case, optical path conversion can be performed.

In the present invention, it is preferable that said position alignment guide formed on one of wall surfaces of the hole is a projection, said position alignment guide formed on the first optical waveguide is a first recess, a second recess is formed on a boundary between the core and the clad of the first optical waveguide, and the first recess is formed right on the second recess.

At this time, since a recess is formed at a position of the core that is a target of the position alignment, the dimensional error in the optical pin side that is a first optical waveguide becomes very small. Further, the first and second recesses have the advantage that they can be easily formed at the positions of a core by a manufacturing process.

Meanwhile, in the present invention, it is preferable that said position alignment guide formed on one of wall surfaces of the hole is a recess, said position alignment guide formed on the first optical waveguide is a projection, and the projection is formed right on the core of the first optical waveguide. At this time, since a projection is formed at a position of the core that is a target of the position alignment, the dimensional error in the optical pin side that is a first optical waveguide becomes very small. Further, the projection has the advantage that it can be easily formed at the position of the core by a manufacturing process.

Furthermore, in the present invention, it is preferable that the second optical waveguide is formed parallel to the substrate surface, the optical axis of the second optical waveguide crosses the optical axis of the first optical waveguide, and a slanted end plane of the core of the first optical waveguide used as a reflective surface is formed at a portion where both optical axes are crossed. Due to this, the optical path is converted in the optical circuit board, thus enabling waveguiding in the thickness direction of the substrate.

Furthermore, the present invention relates to an optical and electric combined board comprising the aforementioned optical circuit board and an electric circuit board laminated with the optical circuit board.

Hereinafter, the first optical waveguide is called an optical pin. The present inventors have conducted an extensive study and as a result, have found that a recess of a clad is formed on the core position of the optical waveguide type optical pin obtained by applying a solution to a resin, and then the recess of the clad is used for forming a space with a shape for putting the recess therein between the optical pin and the optical waveguide layer on the substrate side for inserting the optical pin thereon in advance, thus enabling the easy alignment of the positions. Thus, the present invention has been developed and completed.

Herein, the optical circuit board is a single layer or a laminate of a rigid or flexible optical wiring layer equipped with at least an optical waveguide. The optical wiring layer is wired for electricity as needed or a circuit element, a light receiving element or a light emitting element may be mounted thereon depending on its usage. A laminate of the optical circuit board with the electrical wiring substrate is used as an optical and electric combined board. Further, it is preferable that a hole in which an optical pin is inserted is formed by laser processing. From this, it is possible to form a guide with excellent accuracy. It is preferable that a core and a clad of the first optical waveguide are made of a resin. Furthermore, a surface formed with a position alignment guide thereon is preferably flat except for a recess or a projection of the position alignment guide because of easy manufacturing.

EFFECT OF THE INVENTION

The optical circuit board according to the present invention enables the alignment of the positions of a core just by inserting the optical pin into the hole formed on an optical wiring layer, for example, enables easy and less expensive optical coupling between a surface type optical element and an optical waveguide layer arranged on the same substrate.

BRIEF DESCRIPTION OF THE DRAWINGS

FIG. 12 is a view illustrating a part of manufacture of an optical and electric combined board according to the present invention.

BEST MODE FOR CARRYING OUT THE INVENTION

The present invention will be illustrated below in detail with reference to the drawings. Herein, a polyimide optical waveguide is exemplified as an optical wiring layer and a copper clad polyimide film is exemplified as an electric wiring layer. However, as a material of the optical waveguide and the electric wiring layer, resins other than polyimide can also be used. Further, an optical waveguide layer may be laminated with an electric wiring layer. In addition to such a structure, electric wiring can be directly arranged in the optical waveguide or an optical waveguide alone can also be applied.

Figure 1:
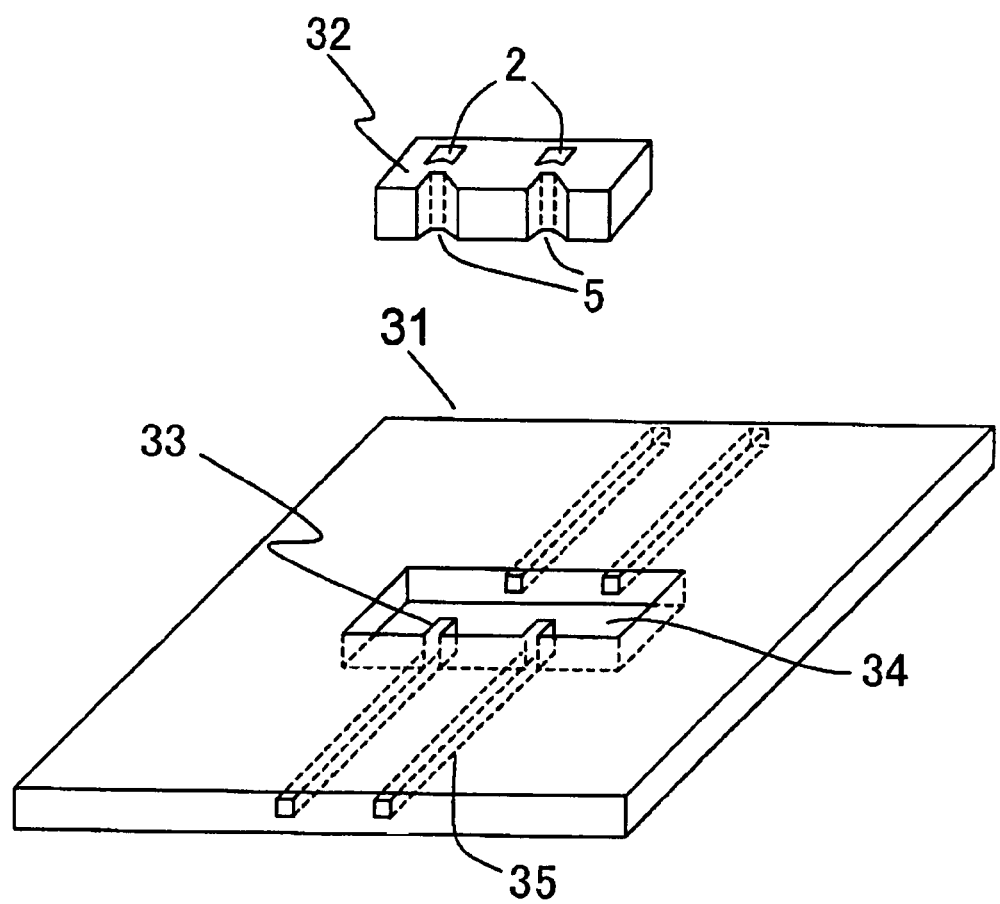
FIG. 1 is a perspective view illustrating examples of an optical circuit board and an optical pin according to the present invention.
Figure 2:
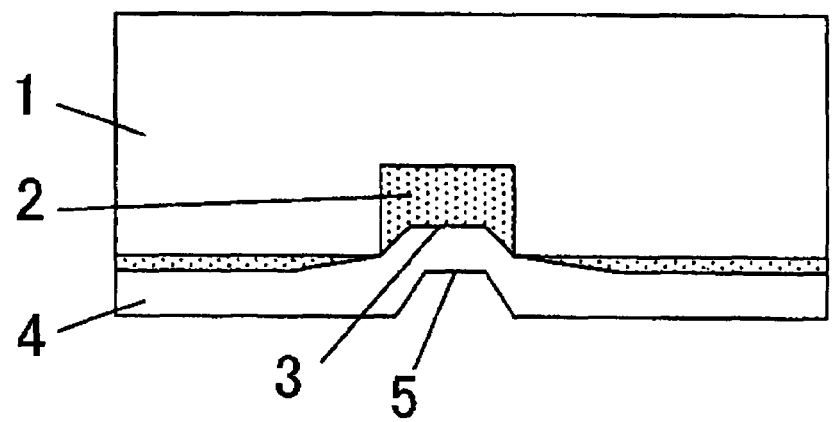
FIG. 2 is a view illustrating an example of the cross-sectional structure of the optical pin according to the present invention.

FIG. 1 illustrates a perspective view of an optical waveguide type optical pin 32 and an optical circuit board 31 equipped with a hole 34 for inserting the optical pin thereinto. Herein, two cores 2 are formed in the optical pin. On one surface of the optical pin are formed groove-shaped recesses 5 corresponding to the positions of the cores. Two waveguides 35 are formed on the optical circuit board 31, each of which is cut in the middle by the hole 34. Also, a guide structure 33 comprising a projection is formed at a position corresponding to the waveguide on one of wall surfaces of the hole. When the optical pin is inserted into the hole 34, the groove-shaped recesses 5 of the optical pin are aligned to projections which are guide structures 33 formed on the wall surface of the hole, thus enabling alignment of the positions of the cores. When a lower end part of the core of the optical pin is cut at a 45 degree angle in advance for forming a reflective surface (not illustrated), it is possible to perform a 90 degree optical path conversion, thus enabling optical interconnection between the core of the optical pin and the waveguide of the optical circuit board. FIG. 2 is a cross section showing an example of an optical waveguide type optical pin to be inserted into the hole arranged in the optical circuit board. A groove is formed in a clad 1 and the core 2 is molded in the groove, on which is further covered with a clad 4 to form an optical waveguide. Herein, a recess 3 is formed on a boundary between the core 2 and the clad 4 and right thereon a recess 5 is also formed on a surface of the clad 4.

Figure 5A:
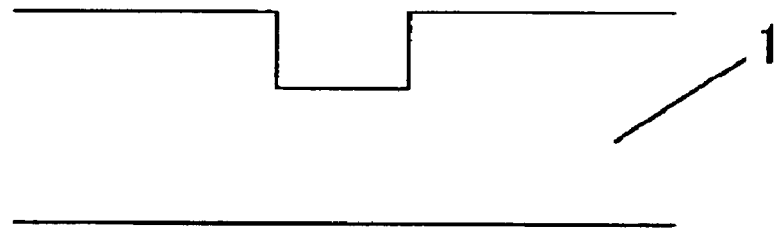
FIG. 5 is a view illustrating an example of the manufacturing process of the optical pin used for the present invention.
Figure 5B:
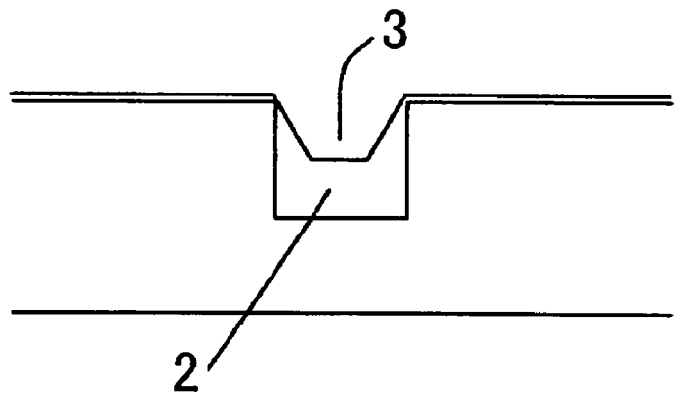
Figure 5C:
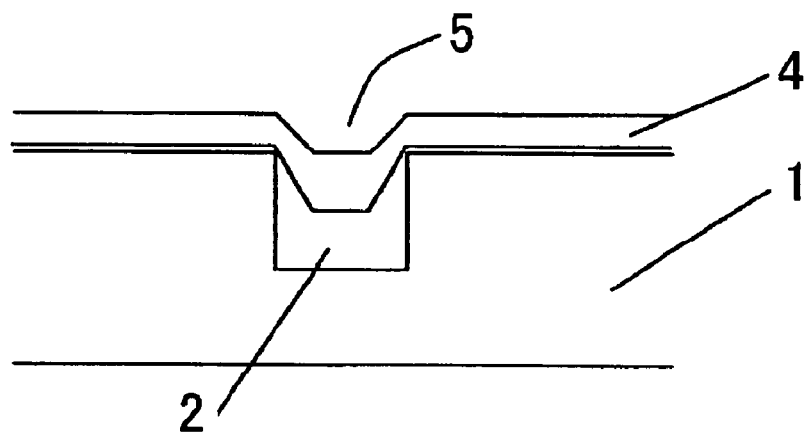

This optical pin is manufactured by known photolithography and oxygen plasma etching from a fluorine containing polyimide. That is, first, a poly(amic acid) solution that is a precursor of a polyimide used as a clad is applied on a surface of a substrate such as silicon wafer or the like and then heated to imide-formation. Then, a photoresist is applied thereon and patterned by exposure, and an oxygen plasma etching is carried out with the photoresist as a mask for forming a groove-shaped recess on the clad 1 as shown in FIG. 5 (*a*). A precursor solution used as the core 2 is molded in the recess by spin coating or the like and heated to imide-formation (FIG. 5 (b)). A precursor solution of the clad 4 is applied therefrom and heated to imide-formation, whereby a molded-in optical waveguide is obtained (FIG. 5 (c)).

At this time, when a poly(amic acid) solution is applied by spin coating or the like in order to form the core 2, the groove-shaped recess 3 is generated on a surface of the core 2 as shown in FIG. 5 (b). A large amount of solvent is volatilized when a poly(amic acid) solution that is a precursor of a polyimide contains a solvent of 70% or more so that the recess is generated. In the same manner, when a precursor solution of a polyimide is used as the clad 4 which covers the top as well as the core, the groove-shaped recess 5 reflecting a recess on the upper surface of the core is generated on the outermost surface of the optical pin. Incidentally, polyimide that is a core material might leak out from both sides of the core depending on a coating method in some cases as shown in FIG. 2. However, its thickness is thin, thus causing no problem.

When this optical waveguide is used as an optical pin for optical coupling between the optical wiring layer and the optical element, the recess 5 is used as a position alignment guide together with a guide structure formed on a wall surface of the hole of the substrate. In this case, a recess used as a guide is formed right on a recess formed on a boundary between the core and the clad so that the recess used as a guide exhibits the position of the core itself. The optical waveguide is cut at desired intervals at right angles to the direction in which the core is extended, whereby it is possible to obtain a plurality of optical pins.

Figure 3:
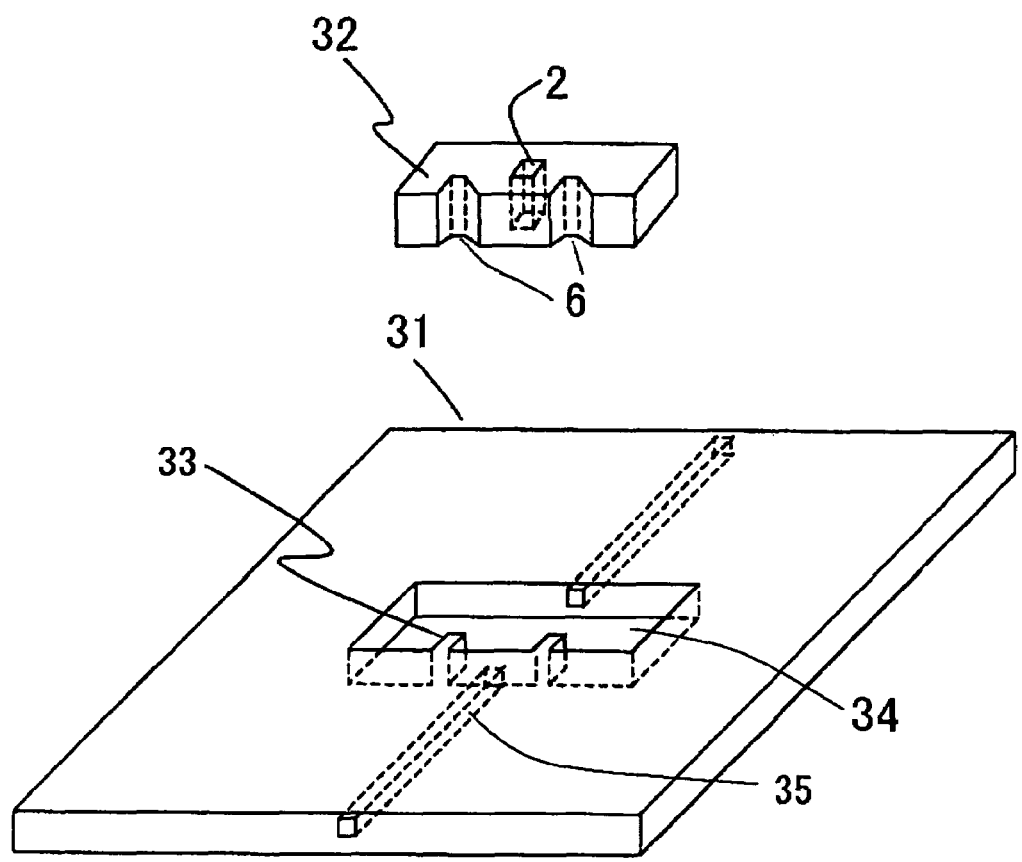
FIG. 3 is a perspective view illustrating examples of an optical circuit board and an optical pin according to the present invention.
Figure 4:
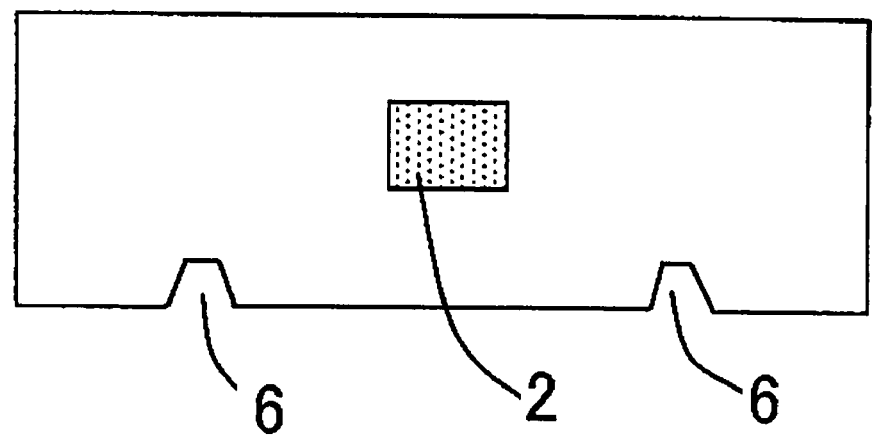
FIG. 4 is a view illustrating an example of the cross-sectional structure of the optical pin according to the present invention.

In case of an optical waveguide manufactured by a manufacturing process which does not naturally form such a recess, a recess may be manufactured by using processing according to photolithography and oxygen plasma etching, or mechanical processing such as dicing processing or the like. In this case, as shown in FIG. 4, recesses 6 may be formed at places different from the position of a core 2. The optical waveguide is cut at desired intervals at right angles to the direction in which the core is extended, whereby it is possible to obtain a plurality of optical pins. FIG. 3 illustrates perspective views of an optical pin 32 of this type and an optical circuit board 31 equipping with a hole 34. A reflective surface (not illustrated) may be formed by cutting the lower end part of the core 2 of the optical pin 32 at a 45 degree angle in advance.

The recess for position alignment is preferably in a shape of a groove. By using this groove-shaped recess, it is possible to slide the optical pin upward and downward with the projection and recess on the wall surface of the hole as integrated when the optical pin is inserted into the hole. So, it becomes easy to align the positions. Furthermore, it is preferable that the groove-shaped recess is formed such that it is extended in a direction of a core pattern in a surface parallel to the core in the optical pin.

Figure 10A:
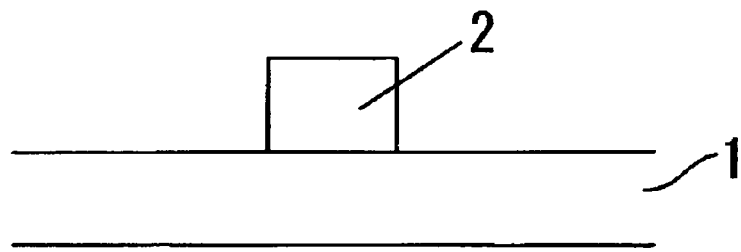
FIG. 10 is a view illustrating an outline of the manufacturing process of the optical pin used in the present invention.
Figure 10B:
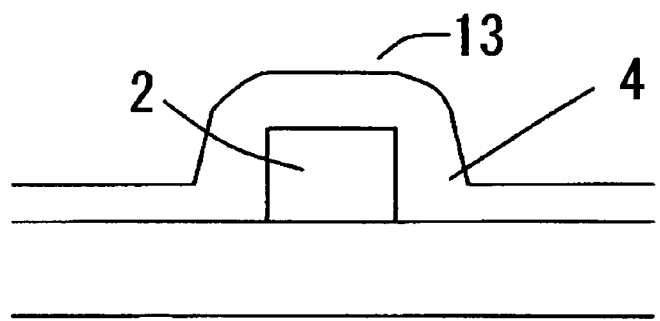

In the optical pin and the guide structure formed on a hole wall surface of the optical circuit board, the optical pin may be a projection and the hole wall surface may be a recess. A method for forming a projection for position alignment on the optical pin is described. A poly(amic acid) solution that is a precursor of a polyimide used as a clad is applied on a substrate such as silicon wafer or the like. Then, the applied solution is heated to imide-formation. In order to form a core thereon, a poly(amic acid) solution is applied by spin coating or the like, and heated and cured for imide-formation. Then, a photoresist is applied thereon and patterned by exposure, and an oxygen plasma etching is carried out with the photoresist as a mask for forming a stripe-shaped projection used as the core 2 as shown in the cross section of FIG. 10 (a). A precursor solution of the clad 4 is applied therefrom and heated to imide-formation, whereby an optical waveguide is obtained (FIG. 10 (b)). At this time, a projection 13 reflecting the stripe-shaped projection of the core is generated on the top of the core 2 as shown in FIG. 10 (b). This projection is used as a position alignment guide. Incidentally, when a guide of the optical pin as a position alignment guide is a projection, a recess is arranged on a wall surface of the hole of the optical waveguide layer. As a method for the formation of the recess, a method for arranging a projection on the wall surface of the hole can be used only by changing its shape.

Figure 6A:
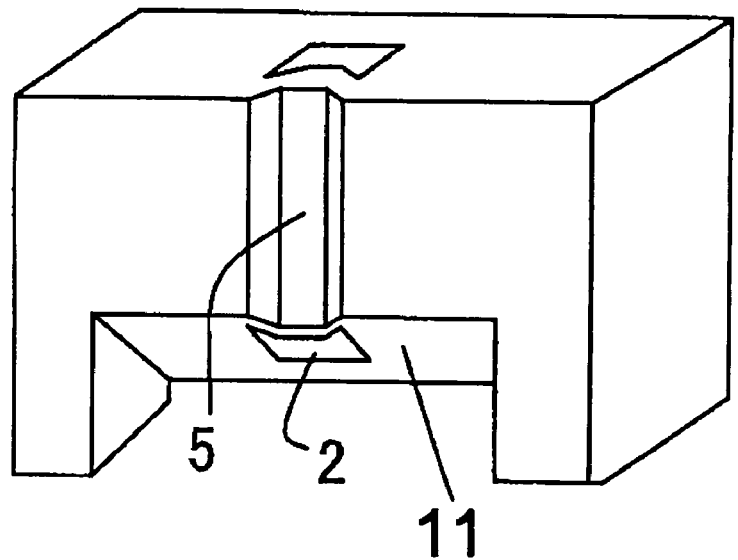
FIG. 6 is a view illustrating an example of the optical pin with a reflective surface for optical path conversion formed thereon used for the present invention.
Figure 6B:
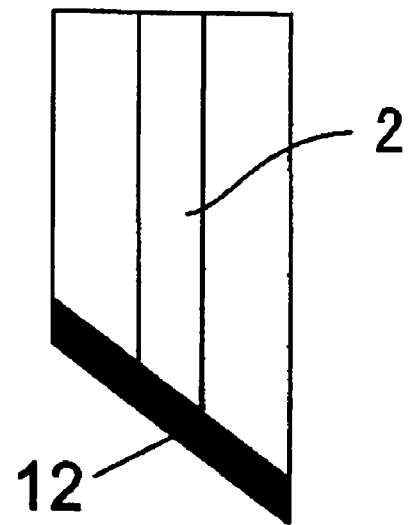

It is possible to provide an optical path conversion function to an optical pin. FIG. 6 shows an example of an optical waveguide type optical pin equipped with a micromirror for optical path conversion. The end part of the optical pin is subjected to a dicing processing or an irradiation with excimer laser, whereby it is cut at a 45 degree angle such that it is hung on the core 2. Thus, it is possible to arrange a 45 degree slanted end plane 11. The core end plane itself is used as a reflective mirror. The 45 degree end plane is preferably coated with a metal film 12 of gold or the like as shown in the cross section of FIG. 6 (b). Furthermore, when the light is vertically waveguided between top and bottom surfaces of the optical circuit board with the optical pin, it is not necessary to arrange the 45 degree end plane. A cuboidal optical pin with core end planes arranged on two surfaces parallel to each other may be employed.

Hereinafter, as an optical circuit board, an optical and electric combined board including optical wiring and electric wiring will be described. However, the present invention can be applied to a usual optical waveguide formed on a silicon substrate, a resin substrate and the like without using an electric wiring layer.

Figure 7A:
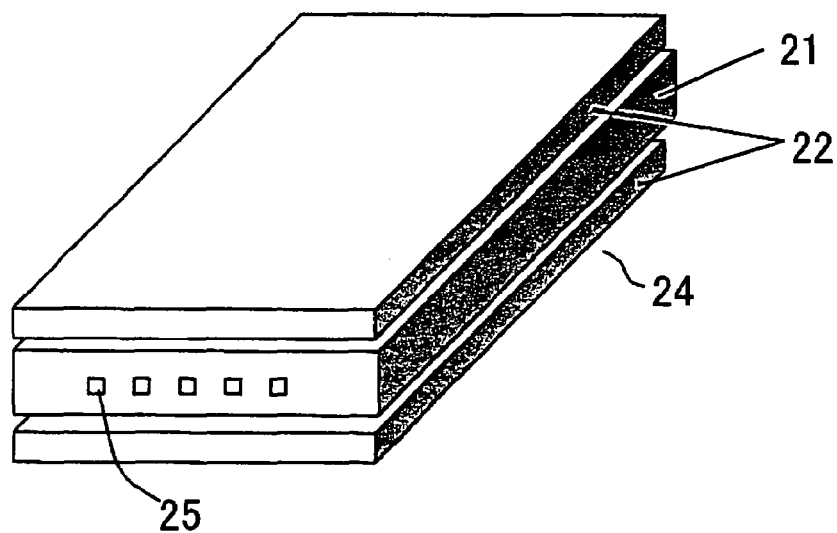
FIG. 7 is a view illustrating an example of an optical and electric combined board according to the present invention.
Figure 7B:
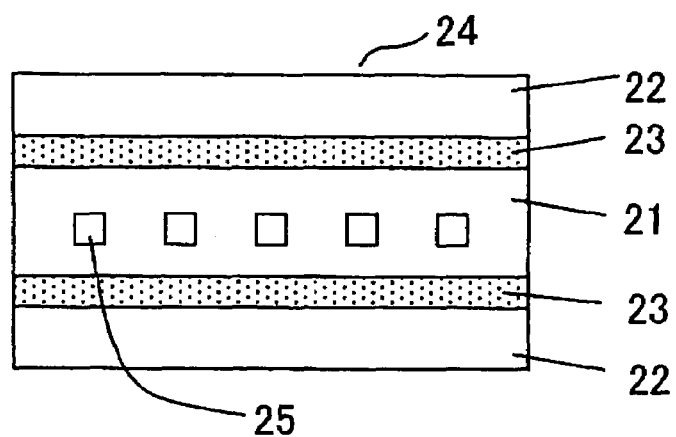

FIG. 7 shows a perspective view (FIG. 7 (a)) and a cross-sectional view (FIG. 7 (b)) of an optical and electric combined board. This substrate is obtained by laminating an optical wiring layer 21 equipped with a core 25 (5 cores in the drawing) having an optical waveguide function with electric wiring layers 22 including copper clad laminates. Here, the optical wiring layer is interposed between two electric wiring layers and they are piled by using adhesive layers 23 such as a thermoplastic polyimide, an epoxy resin or the like to manufacture an optical and electric combined board 24 by a hot press. A hole is formed on the optical and electric combined board as shown in FIG. 1 or 3. The hole (not illustrated) may be formed by making a hole so as to cover only a core necessary for optical interconnection with an optical pin.

To form a hole with a guide structure attached thereto on an optical and electric combined board, the mutual position accuracy between the guide structure and the core present in the optical and electric combined board becomes very important. In case of an optical and electric combined board with an optical wiring layer interposed between electric wiring layers, a marker at an optical waveguide side may be viewed by making a hole at an electric wiring layer side in advance, in order to observe the core position of the optical waveguide at the time of position alignment for making a hole. Alternatively, when the electric wiring layer is thin or relatively transparent, in a portion without having a copper foil, a marker formed on an optical waveguide core or an optical waveguide can be viewed. The position of the guide structure can be determined while confirming the position of the core or marker after a part of the copper foil is subjected to etching in advance or the copper foil is patterned.

The guide structures are formed simultaneously with hole making by laser processing, drill processing or the like. In case of laser processing, an optical mask in use may be given with a shape including a guide structure. When a copper clad polyimide film is used as an electric wiring layer, by irradiating laser through the optical mask formed with a hole shape having a guide structure it is possible to simply form a hole equipped with a guide structure of a projection and a recess in a shape that is easily inserted into a recess or a projection of an optical pin.

Figure 8A:
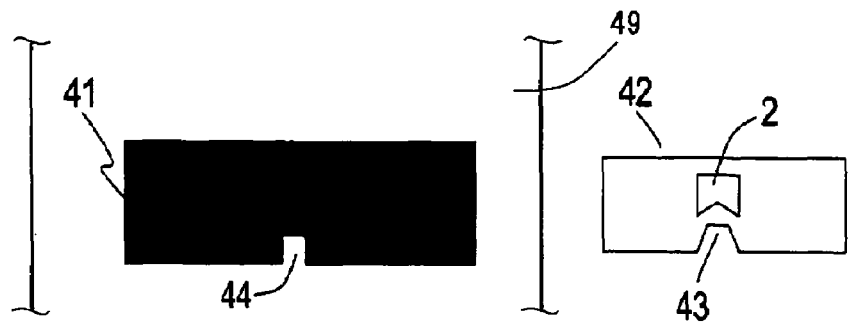
FIG. 8 is a view illustrating an example of alignment of the positions of a hole and an optical pin formed in an optical circuit board according to the present invention.
Figure 8B:
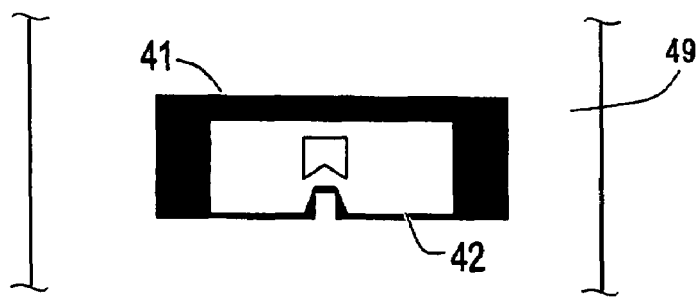

FIG. 8 illustrates a method for inserting an optical pin into a hole. The optical pin 42 is inserted into a hole 41 formed on an optical and electric combined board 49. At this time, the recess 43 at the optical pin side is aligned with the projection-shaped guide structure 44 formed on the substrate side to tightly press the optical pin for fixing it to the wall surface by an adhesive. According to this, it is possible to determine the position of the core. The hole size is determined by aligning the size of the projection part 44 of the hole and the size other than the projection part to the appearance shape and size of the optical pin.

Figure 11A:
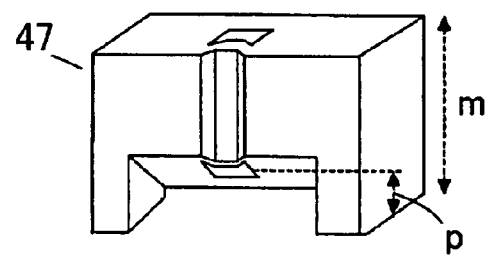
FIG. 11 is a view illustrating an optical pin and an optical circuit board according to the present invention.
Figure 11B:
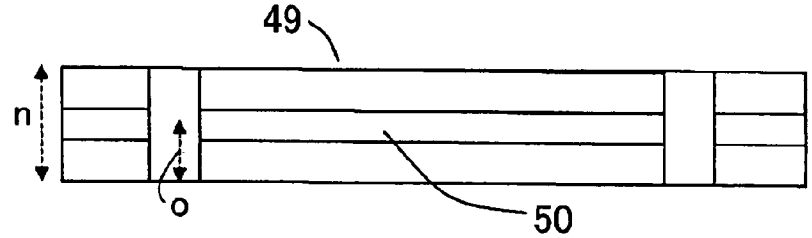
Figure 13A:
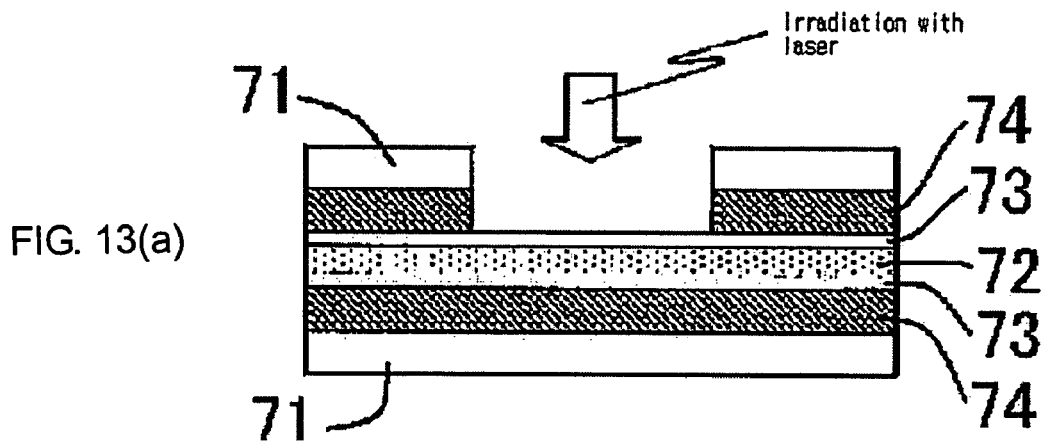
FIG. 13 is a view illustrating a part of manufacture of an optical and electric combined board according to the present invention.
Figure 13B:
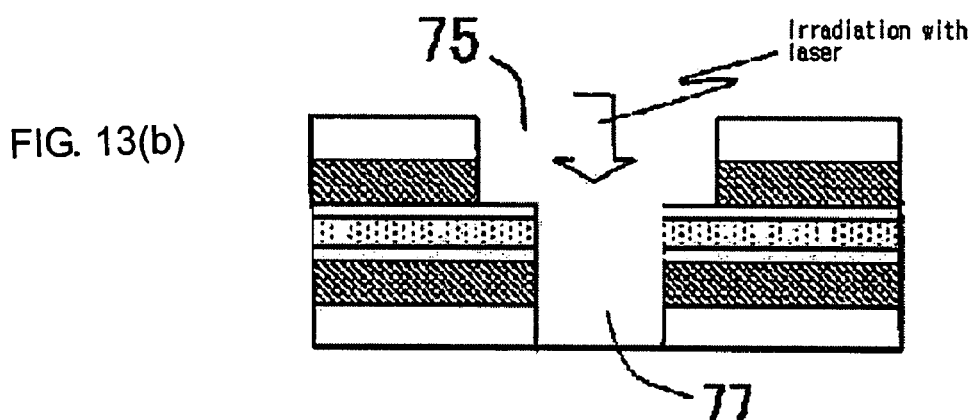
Figure 13C:
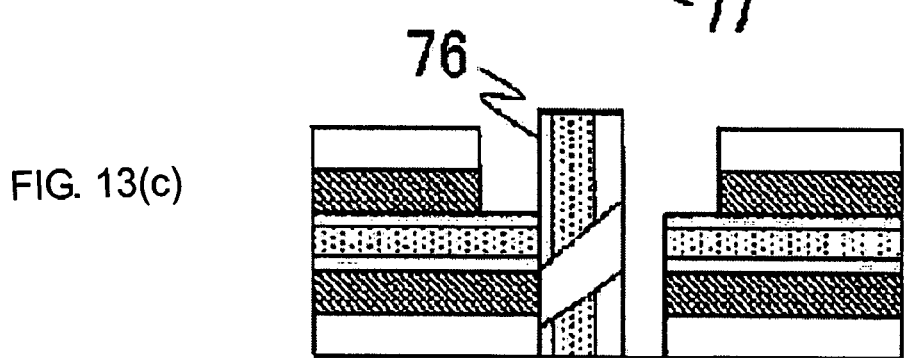
Figure 13D:
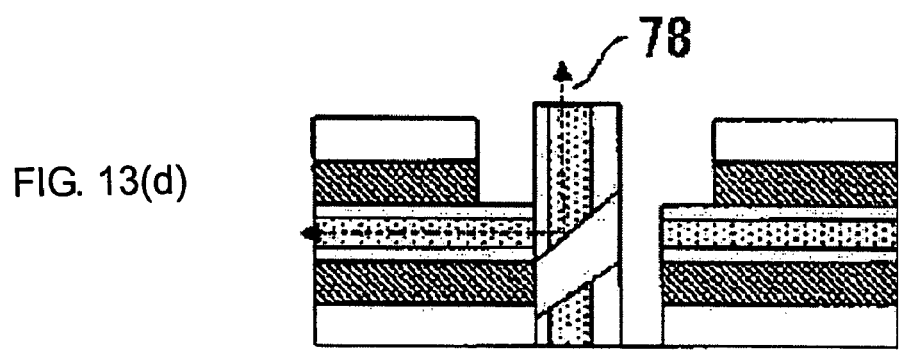

The position in the depth direction may be determined in the following method. FIG. 11 shows a conceptual view of the position alignment. For example, in case of an optical pin 47 in which one end plane thereof is subjected to mirror surface finishing at a 45 degree angle by laser processing, the position of the mirror surface can be determined by obtaining the total length m of the optical pin, the thickness n of the optical and electric combined board 49, and the height o from the bottom of a core 50 of the optical waveguide layer in the optical and electric combined board. The height p of the position of the optical pin subjected to mirror surface finishing at a 45 degree angle aligns with the core position of the substrate for carrying out laser processing. When the optical and electric combined board for receiving the optical pin is put on a flat plate, the position of the substrate in the depth direction can be aligned only by inserting the optical pin into the substrate. Incidentally, the guide structure and the guide in the optical pin side may be of a size or shape to be tightly inserted into each other, but they not necessarily be of such a shape and may be of other shapes with enough room. The positions thereof may be aligned such that a part of a projection on one side bumps against a part of a recess on the other side.

Figure 9:
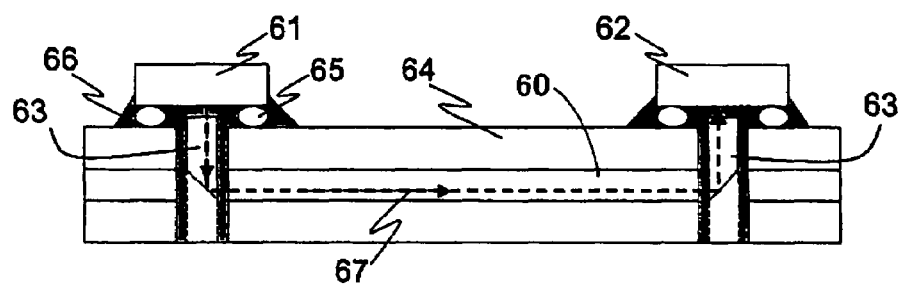
FIG. 9 is a view illustrating an example of optical signal transmission form using an optical and electric combined board.

An optical transmission form using the thus-obtained optical and electric combined board is shown in FIG. 9. On an electric circuit board 64 laminated with an optical wiring layer 60, a light emitting element 61 and a light receiving element 62 are mounted by the use of solder balls 65. The position of an optical pin 63 is determined by the position alignment guide, while a space between the upper part of the optical pin 63 and the light emitting element or the light receiving element is filled in with a transparent resin 66 for an oscillating wavelength of the light emitting element. There may be a gap between the core end part of the optical pin and the light receiving and emitting elements. By using such an optical and electric combined board, light signals can be transmitted through an optical path 67 (shown in dotted line) between the light emitting element and the light receiving element.

However, a micromirror that is a reflective surface for optical path conversion may not be formed on the optical pin, but can be arranged on the optical wiring layer side. FIG. 12 illustrates an example of a processing method for forming a micromirror for optical path conversion on the optical wiring layer. The optical and electric combined board in the drawing is obtained by laminating an optical wiring layer equipped with an optical waveguide including a core 72 and clads 73 between electric circuit boards 71 via adhesive layers 74 (FIG. 12 (a)). A hole 75 reaching the clad layer passing through the adhesive layer is formed by laser processing such as excimer or the like from the electric circuit board 71 (FIG. 12 (b)). By adjusting the time for laser irradiation, the depth of the hole to be formed can be controlled. The guide structure of a recess or a projection is formed on the wall surface of the hole. The core of the optical wiring layer is viewed through this hole. Thereafter, laser irradiation is carried out toward the core 72 slantingly from the hole to form a 45 degree micromirror surface 77 on the core end plane (FIG. 12 (c)). If necessary, the micromirror surface is coated with a metal film by deposition or the like. Then, a short optical waveguide type optical pin 76 is inserted in alignment with the guide and fixed by an adhesive (FIG. 12 (d)). The length of the optical waveguide is determined by calculating the thickness of the electric circuit board, the thickness of the adhesive layer, the distance between the substrate and optical elements. The optical path at this time passes through the optical pin, clad layer, 45 degree micromirror surface of the core layer, and the core layer.

Meanwhile, to form a hole for inserting the optical pin thereinto, when the electric wiring layer and adhesive layer are opaque, and the core position of the optical wiring layer is hardly viewed from the top, a hole 75 reaching a clad layer 73 passing through an electric wiring plate 71 and an adhesive layer 74 is formed in advance by laser processing or the like, as shown in FIG. 13 (a). Through this hole, a core 72 of the optical wiring layer is viewed. Then, a hole 77 equipped with a guide structure is formed toward the core 72 by laser processing or the like (FIG. 13 (b)). Then, an optical pin 76 is inserted into the hole 77 in alignment with the guide and fixed by an adhesive (FIG. 13 (c)). At this time, a hole passing through the core at a 45 degree angle is formed on the optical pin by laser processing, dicing processing or the like, and a mirror surface is formed on its end plane in advance. By this, an optical path 78 is formed as shown in FIG. 13 (d). Thus, even when an electric circuit board and an adhesive layer are not transparent, and the core of the optical wiring layer is hardly viewed, an optical and electric combined board can be manufactured.

EXAMPLES

A polyimide formed from 2,2-bis(3,4-dicarboxyphenyl) hexafluoro propane dianhydride (6FDA) and 2,2-bis(trifluoromethyl)-4,4'-diaminobiphenyl (TFDB) was used as a clad, and a polyimide formed from a copoly(amic acid) solution of 6FDA and TFDB, and 6FDA and 4,4'-oxydianiline (ODA) was used as a core. Such polyimides were processed on a surface of a 5 inch-silicon wafer by photolithography and dry etching technique to form a molded-in optical waveguide film. First, to the surface of silicon wafer was applied the above polyimide precursor solution and the applied solution was heated to imide-formation to obtain a clad layer. A recess of 60 micro-meters in width and 48 micro-meters in length was formed on the clad layer by known photolithography and dry etching. Then, the above solution used as the core was applied by spin coating to fill in the recess. After the solution was heated to imide-formation, the solution used as the clad was applied on the core by spin coating and heated to imide-formation to further form a clad. At this time, a groove-shaped recess of about 20 micro-meters was generated on the upper part of the core at the surface of the clad. Thereafter, an optical waveguide on the silicon wafer was immersed in 5 weight % aqueous HF solution and the optical waveguide was stripped from the silicon wafer to prepare a film optical waveguide. The film thickness of fluorinated polyimide optical waveguide was 70 micro-meters, while the core size was 60 micro-meters in width and 25 micro-meters in height from the lowest part. Then, in order to enhance adhesiveness on both surfaces of the fluorinated polyimide, thermoplastic polyimides were formed as thick as 1 micro-meter respectively by spin coating and heat treatment. A polyimide containing oxy-diphthalic dianhydride (ODPA) and aminophenoxybenzene (APB) was used for the thermoplastic polyimide.

Next, in order to manufacture an optical and electric combined board, there were prepared two of polyimide films with a copper foil attached on one surface in which a copper layer on one surface of a copper clad polyimide film (NEX, a product of Mitsui Chemicals, Inc.) was subjected to etching. The PET film was coated with an epoxy resin at a thickness of 25 micro-meters by an applicator in advance and dried at 140 degree centigrade. The resulting epoxy resin film was laminated on both surfaces of the optical waveguide by a laminator at 100 degree centigrade. Thereafter, the PET film was stripped. The epoxy resin at a thickness of 25 micro-meters (EPOX (registered trademark), AH357, a product of Mitsui Chemicals, Inc.) was used as an adhesive layer. The two polyimide films with a copper foil attached to one surface was fixed adhesively by a heating press on both sides of polyimide film surface of the optical waveguide film. The press temperature was 170 degree centigrade, the press pressure was 2 MPa, and the press time was 80 minutes. The total thickness including the copper foil was about 160 micro-meters. By this, a laminate used as an optical circuit board was obtained. Then, the copper foil for electric circuit wiring was subjected to patterning. At this time, the copper foil at the end of the optical and electric combined board was subjected to etching and a marker previously attached to the optical waveguide was observed. Depending on this marker, the optical waveguide core was copper-patterned with good accuracy.

Next, a hole for an input and output part of light was formed by excimer laser processing. A laminate used as an optical circuit board was irradiated with a Krf excimer laser (wavelength: 248 nm) at a pulse of 200 Hz with an irradiation energy density of 1 J/(cm$^2$·pulse) for 4 seconds for forming a hole. The hole was formed in a shape with projections corresponding to recesses formed on an optical waveguide used as an optical pin, as shown in FIGS. 1 and 3. In order to form the hole of this shape, an optical mask in such a shape was used upon laser irradiation. The size of the projection part arranged in the hole was 40 micro-meters×40 micro-meters. The total size of the hole was 1100 micro-meters×200 micro-meters. The core center position of the optical waveguide layer was 83 micro-meters from the bottom of the back surface copper foil to the top.

Next, the optical waveguide with recesses attached thereto used as the optical pin which was previously prepared was cut in a length of 200 micro-meters by dicing processing. Its width was 1 mm. The optical waveguide position was determined such that 83 micro-meters from the end became the center of the mirror surface of the core, which was slantingly processed with an excimer laser. A 200 square-µm mask was used for laser processing. Then, a metal film of about 300 micro-meters was deposited only on the processed surface. A micromirror for optical path conversion was manufactured with an angle of the obtained surface of 45 degrees. In this manner, an optical pin with the micromirror for optical path conversion attached thereto could be manufactured.

Subsequently, this optical pin was inserted into the guide-attached hole formed on the optical and electric combined board. An adhesive was applied on the hole. The optical pin bumped against the bottom, whereby the position alignment in the height direction was completed. At this time, even if the optical pin was projected 40 micro-meters upward to the top, when the substrate equipped with surface light receiving and emitting elements were mounted by soldering, the light receiving and emitting elements were positioned higher on the optical and electric combined board by the height of the solder. By protruding the optical pin, light could be induced to right before the light receiving and emitting elements with the optical waveguide. The adhesive was heated and cured at a rate of 150 degree centigrade/1 hour. A gap on a side opposite to a surface side with a recess formed thereon was similarly molded with an epoxy-based adhesive and cured. In this manner, the positions of the optical pin and the optical waveguide layer could be simply aligned. Thus, an optical pin was formed on both sides of the light emitting side and the light receiving side, and light was introduced from the light emitting side. As a result, light signals could be taken out from the light receiving side. When the optical pin was inserted into the hole, a tilt of the optical pin could be as small as below 2° which could be negligible by pressing the surface of the optical pin with a recess formed thereon and the wall surface of the hole with the guide formed therein.

INDUSTRIAL APPLICABILITY

The present invention can be applied to an optical integrated circuit, an optical part for an optical interconnection, an optical and electric combined board, and the like.

The invention claimed is:

1. An optical circuit board comprising a hole, a first optical waveguide inserted into the hole and equipped with a core extended in the depth direction of the hole and equipped with a clad, a second optical waveguide having a core extended in the in-plane direction is equipped in said optical circuit board, position alignment guides in the form of a recess or a projection formed on one of its outer surfaces of the first optical waveguide and one of wall surfaces of said hole wherein the position alignment guide formed on one of the outer surfaces of the first optical waveguide is a recess and the position alignment guide formed on one of the wall surfaces of said hole is a projection, and a reflective surface for converting the direction of the optical path of the first optical waveguide to the optical path of the second optical waveguide.

2. The optical circuit board as set forth in claim 1, wherein said position alignment guide formed on the first optical waveguide is a first recess, a second recess is formed on a boundary between the core and the clad of the first optical waveguide, and the first recess is formed right on the second recess.

3. The optical circuit board as set forth in claim 1, wherein the position alignment guides are formed at positions different from the positions of the core.

4. The optical circuit board as set forth in claim 1, wherein said reflective surface is formed in the first optical waveguide slantingly with respect to the first optical waveguide plane.

5. The optical circuit board as set forth in claim 4, wherein said reflective surface is formed on the end part of the first optical waveguide.

6. An optical and electric combined board comprising the optical circuit board as set forth in claim 1 and an electric circuit board laminated with the optical circuit board.

7. The optical circuit board as set forth in claim 1, wherein said reflective surface is formed in the second optical waveguide slantingly with respect to the second optical waveguide plane.

8. An optical circuit board comprising an optical pin equipped with a first optical waveguide having a core and a clad, wherein a second optical waveguide having a core extended in the in-plane direction is equipped in said optical circuit board;

a hole is formed in said optical circuit board so that said hole is formed in the middle of said second optical waveguide;

said optical pin is inserted into said hole, said first optical waveguide with said core and said clad is extended in the depth direction of said hole when said optical pin is inserted into said hole, so that the optical axis of said first optical waveguide crosses the optical axis of the second optical waveguide;

position alignment guides in the form of a recess or a projection are formed on one of outer surfaces of said optical pin and one of wall surfaces of said hole wherein the position alignment guide formed on one of the outer surfaces of the optical pin is a recess and the position alignment guide formed on one of the wall surfaces of said hole is a projection; and a reflective surface for converting the direction of the optical path of said first optical waveguide to said second optical waveguide is formed in said first optical waveguide or said second optical waveguide.

9. An optical circuit board comprising a hole, a first optical waveguide inserted into the hole and equipped with a core extended in the depth direction of the hole and equipped with a clad, a second optical waveguide having a core extended in the in-plane direction is equipped in said optical circuit board, position alignment guides in the form of a recess or a projection formed on one of its outer surfaces of the first optical waveguide and one of wall surfaces of said hole wherein the position alignment guide formed on one of the outer surfaces of the first optical waveguide is a projection and the position alignment guide formed on one of the wall surfaces of said hole is a recess, and a reflective surface for converting the direction of the optical path of the first optical waveguide to the optical path of the second optical waveguide.

10. The optical circuit board as set forth in claim 9, wherein said position alignment guide formed on the first optical waveguide is a projection formed right on the core of the first optical waveguide.

11. The optical circuit board as set forth in claim 9, wherein the position alignment guides are formed at positions different from the positions of the core.

12. The optical circuit board as set forth in claim 9, wherein said reflective surface is formed in the first optical waveguide slantingly with respect to the first optical waveguide plane.

13. The optical circuit board as set forth in claim 12, wherein said reflective surface is formed on the end part of the first optical waveguide.

14. An optical and electric combined board comprising the optical circuit board as set forth in claim 9 and an electric circuit board laminated with the optical circuit board.

15. The optical circuit board as set forth in claim 9, wherein said reflective surface is formed in the second optical waveguide slantingly with respect to the second optical waveguide plane.

16. An optical circuit board comprising an optical pin equipped with a first optical waveguide having a core and a clad, wherein a second optical waveguide having a core extended in the in-plane direction is equipped in said optical circuit board;

a hole is formed in said optical circuit board so that said hole is formed in the middle of said second optical waveguide;

said optical pin is inserted into said hole, said first optical waveguide with said core and said clad is extended in the depth direction of said hole when said optical pin is inserted into said hole, so that the optical axis of said first optical waveguide crosses the optical axis of the second optical waveguide;

position alignment guides in the form of a recess or a projection are formed on one of outer surfaces of said optical pin and one of wall surfaces of said hole wherein the position alignment guide formed on one of the outer surfaces of the optical pin is a projection and the position alignment guide formed on one of the wall surfaces of said hole is a recess; and a reflective surface for converting the direction of the optical path of said first optical waveguide to said second optical waveguide is formed in said first optical waveguide or said second optical waveguide.

* * * * *